(12) United States Patent
Li

(10) Patent No.: US 7,429,177 B2
(45) Date of Patent: Sep. 30, 2008

(54) FLEXIBLE PRINTED CIRCUIT BOARD WITH CONTOURED CONDUCTIVE LINES

(75) Inventor: Ning-Jiang Li, Shenzhen (CN)

(73) Assignees: Innocom Technology (Shenzhen) Co., Ltd., Shenzhen, Guangdong Province (CN); Innolux Display Corp., Muao-Li County (TW)

( * ) Notice: Subject to any disclaimer, the term of this patent is extended or adjusted under 35 U.S.C. 154(b) by 0 days.

(21) Appl. No.: 12/005,704

(22) Filed: Dec. 27, 2007

(65) Prior Publication Data

US 2008/0160798 A1  Jul. 3, 2008

(30) Foreign Application Priority Data

Dec. 29, 2006  (TW) .............................. 95223102 U

(51) Int. Cl.
*H01R 12/00* (2006.01)

(52) U.S. Cl. ........................................ 439/77; 439/951

(58) Field of Classification Search .................. 439/77, 439/67, 495, 923, 492, 951

See application file for complete search history.

(56) References Cited

U.S. PATENT DOCUMENTS

| 4,815,981 | A | 3/1989 | Mizuno |  |
|---|---|---|---|---|
| 6,858,921 | B2 * | 2/2005 | Kashiwagi et al. | 257/668 |
| 7,018,018 | B2 * | 3/2006 | Kim | 347/58 |
| 7,137,828 | B2 * | 11/2006 | Yu et al. | 439/67 |
| 2003/0060062 | A1 * | 3/2003 | Honda et al. | 439/67 |

* cited by examiner

*Primary Examiner*—Neil Abrams
*Assistant Examiner*—Phuong Nguyen
(74) *Attorney, Agent, or Firm*—Wei Te Chung

(57) ABSTRACT

An exemplary flexible printed circuit board (2) includes a wiring layer (21). The wiring layer includes a number of conductive lines (211). Each of the conductive lines includes a finger (213), a line portion (212) and a junction portion (214) between the finger and the line portion. A width of the finger is greater than a width of the line portion, a width of the junction portion gradually changes from the width of the line portion to the width of the finger. The flexible printed circuit board has high reliability.

10 Claims, 2 Drawing Sheets

FLEXIBLE PRINTED CIRCUIT BOARD WITH CONTOURED CONDUCTIVE LINES

FIELD OF THE INVENTION

The present invention relates to flexible printed circuit boards, and particularly to a flexible printed circuit board having high reliability for connecting electrical circuits.

GENERAL BACKGROUND

Many electronic appliances such as liquid crystal display monitors need flexible printed circuit (FPC) boards to connect various electronic circuits together. FPC boards are necessary components in many electronic devices having folding portions.

Referring to FIG. 4, a typical FPC board 1 includes a wiring layer 11, an insulating layer 12, and a reinforcing layer 13. The insulating layer 12 covers most of the wiring layer 11 to protect the wiring layer 11 from being exposed to air. The reinforcing layer 13 covers part of the insulating layer 12 to reinforce the mechanical strength of the FPC board 1. The wiring layer 11 includes a plurality of conductive lines 111. The conductive lines 111 are separate from each other, and are generally parallel to each other. Each of the conductive lines 111 includes a line portion 112 and a finger 113. The fingers 113 connect with external circuits or chips. In order to ensure mechanical and electrical contact when the fingers 113 are connected to an external circuit or chip, a width of each finger 113 is greater than a width of the corresponding line portion 112.

Referring to FIG. 5, because the width of the finger 113 is greater than the width of the line portion 112, a junction portion (not labeled) between the finger 113 and the line portion 112 forms sharp right angles. That is, the width of the line portion 112 at one side of the junction portion is much less than the width of the finger 113 at the other side of the junction portion. Thus when the FPC board 1 is bent or the conductive lines 111 are subjected to other stress, the conductive lines 111 are liable to fracture or even break at the junction portions. Therefore the reliability of the FPC board 1 may be unsatisfactory.

Referring to FIG. 6, a strength of the material of the reinforcing layer 13 is greater than a strength of the material of the insulating layer 12 and a strength of the material of the wiring layer 11. In addition, a thickness of the FPC board 1 is non-uniform. For these reasons, tension force at a transverse edge portion of the reinforcing layer 13 at a middle portion of the FPC board 1 is great. Thus the conductive lines 111 are liable to fracture or break at the edge portion when the FPC board 1 is bent. This is another reason why the reliability of the FPC board 1 may be unsatisfactory.

What is needed, therefore, is an FPC board that can overcome the above-described deficiencies.

SUMMARY

In one preferred embodiment, an FPC board includes a wiring layer including a plurality of conductive lines, each of the conductive lines including a finger, a line portion, and a junction portion between the finger and the line portion, a width of the finger being greater than a width of the line portion, a width of the junction portion gradually changing from the width of the line portion to the width of the finger.

Other novel features and advantages of the present FPC board will become more apparent from the following detailed description when taken in conjunction with the accompanying drawings. In the drawings, all the views are schematic.

DETAILED DESCRIPTION OF PREFERRED EMBODIMENTS

Figure 1:
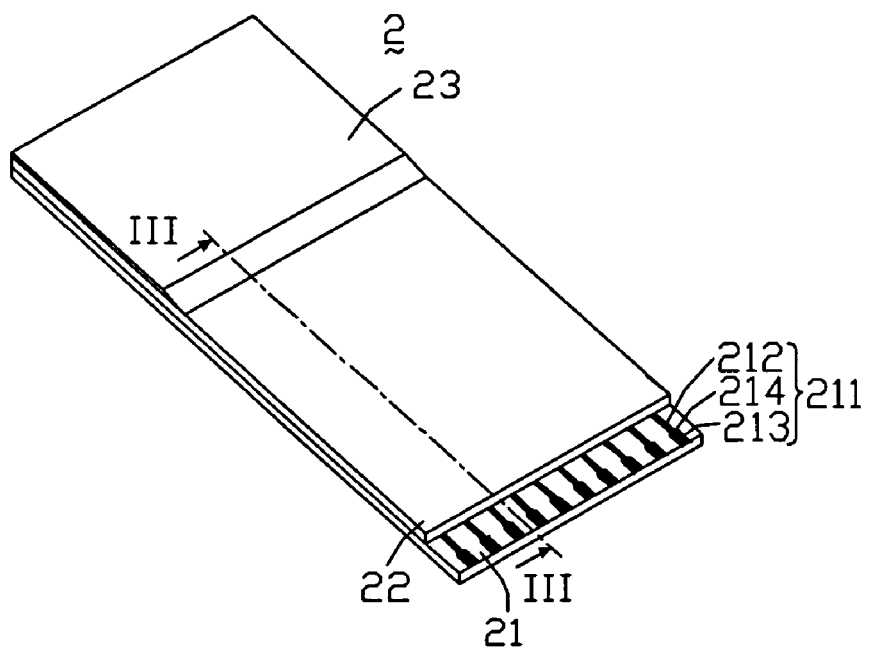
FIG. 1 is an isometric view of an FPC board according to an exemplary embodiment of the present invention, the FPC board including a wiring layer, the wiring layer including a plurality of conductive lines.

Reference will now be made to the drawing figures to describe various embodiments of the present invention in detail.

Referring to FIG. 1, an FPC board 2 according to an exemplary embodiment of the present invention is shown. The FPC board 2 includes a wiring layer 21, an insulating layer 22, and a reinforcing layer 23. The insulating layer 22 covers most of the wiring layer 21 to protect the wiring layer 21 from being exposed to air. The reinforcing layer 23 covers part of the insulating layer 22 to reinforce the mechanical strength of the FPC board 2. The wiring layer 21 includes a base substrate (not labeled), and a plurality of conductive lines 211 on the base substrate. The conductive lines 211 are generally separated from each other, and are parallel to each other. Each of the conductive lines 211 includes a finger 213, a line portion 212, and a junction portion 214 between the finger 213 and the line portion 212. The fingers 213 of the conductive lines 211 are configured to connect to external circuits or chips (not shown). That is, the fingers 213 function as connection pads. The line portion 212 of each conductive line 211 connects with the finger 213 via the junction portion 214. In order to ensure mechanical and electrical contact when the fingers 213 are connected to an external circuit or chip, a width of each finger 213 is greater than a width of the corresponding line portion 212. The line portions 212 of the conductive lines 211 are made from copper foil. The fingers 213 are made from gilded copper. The base substrate is made from polyimide (PI), polyethylene terephthalate (PET), polyester, or polytetrafluoroethylene (PTFE). A thickness of the base substrate is in the range from 10 microns (μm) to 100 μm. The insulating layer 22 can be made from polyimide (PI). The reinforcing layer 23 can be made from aluminum (Al).

Figure 2:
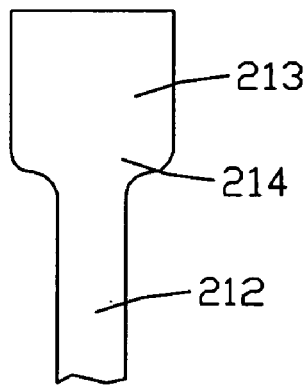
FIG. 2 is an enlarged, top plan view of part of one of the conductive lines of FIG. 1.

Referring to FIG. 2, part of one of the conductive lines 211 is shown. A width of a bottom end of the junction portion 214 is equal to a width of the line portion 212, and a width of a top end of the junction portion 214 is equal to the width of the finger 213. Two opposite edges of the junction portion 214 are smooth curves or a combination of smooth curves and straight lines. In the illustrated embodiment, each of the opposite edges of the junction portion 214 has a gently curving, generally S-shaped configuration. For example, each opposite edge can include two arcuate bends arranged end-to-end, with the arc of each arcuate bend being one-quarter of a same circle. Thus, a width of the conductive line 211 changes gradually at the junction portion 214. Because there is no sudden change in width between the finger 213 and the line portion 212, the conductive line 211 is less liable to fracture or break when the FPC board 2 is bent or folded. Compared to a conventional FPC board, the FPC board 2 has improved reliability.

Figure 3:
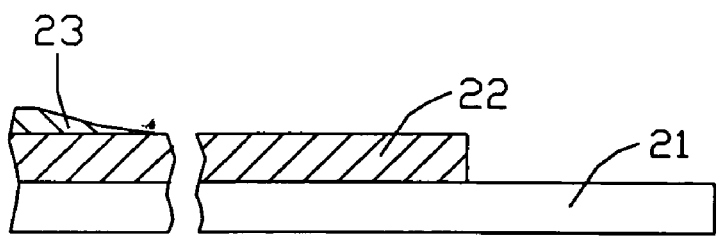
FIG. 3 is an enlarged, abbreviated, cross-sectional view of the FPC board taken along line III-III of FIG. 1.
Figure 4:
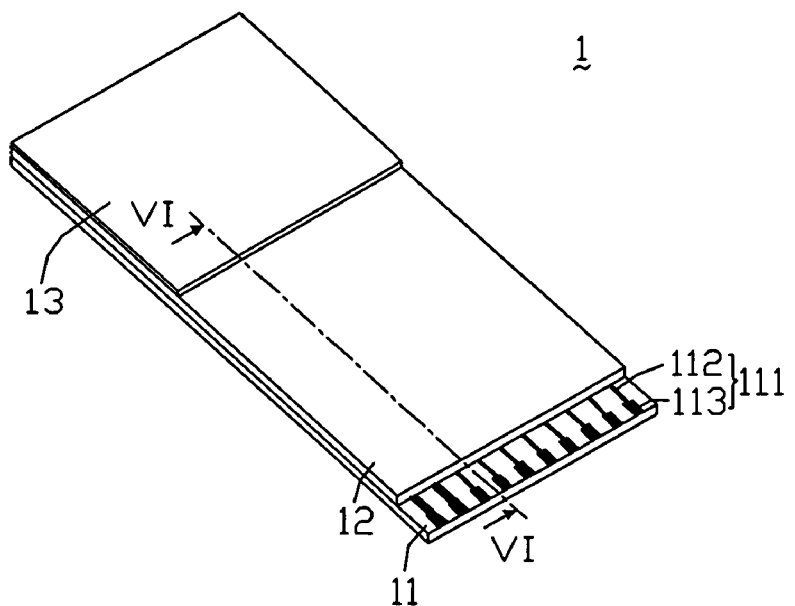
FIG. 4 is an isometric view of a conventional FPC board, the FPC board including a wiring layer, the wiring layer including a plurality of conductive lines.
Figure 5:
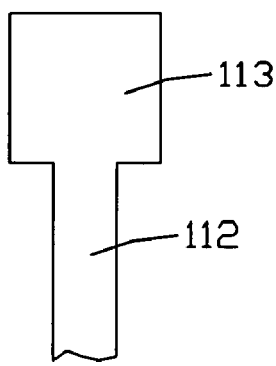
FIG. 5 is an enlarged, top plan view of part of one of the conductive lines of FIG. 4.
Figure 6:
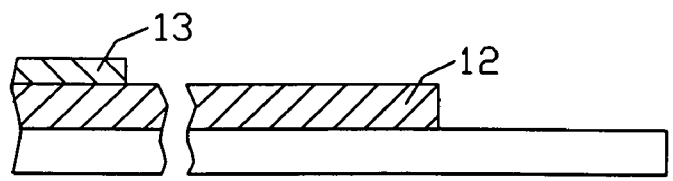
FIG. 6 is an enlarged, abbreviated, cross-sectional view taken along line VI-VI of FIG. 4.

Referring to FIG. 3, the reinforcing layer 23 covers part of the insulating layer 22. A strength of the material of the reinforcing layer 23 is greater than a strength of the material of the insulating layer 22 and a strength of the material of the base substrate of the wiring layer 21. A transverse edge portion (not labeled) of the reinforcing layer 23 at a middle portion of the FPC board 2 has a shape of a wedge. That is, a thickness of the FPC board 2 changes gradually at the edge portion of the reinforcing layer 23. Because there is no sudden change in thickness of the middle portion of the FPB board 2, a tension force at the edge portion of the reinforcing layer 23 is reduced. Therefore the conductive lines 211 of the FPC board 2 are less liable to fracture or break at the edge portion of the reinforcing layer 23. Thus, the reliability of the FPC board 2 is further improved.

It is to be understood, however, that even though numerous characteristics and advantages of the present embodiments have been set out in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A flexible printed circuit (FPC) board, comprising:
    a wiring layer comprising a plurality of conductive lines, each of the conductive lines comprising a finger, a line portion, and a junction portion between the finger and the line portion, a width of the finger being greater than a width of the line portion, a width of the junction portion gradually changing from the width of the line portion to the width of the finger to prevent overstress or break at the junction when the flexible printed circuit board is bent, two edges of the junction portion being curved lines; the junction portion comprising a first end and a second end, the first end connecting with the line portion, and the second end connecting with the finger; a width of the first end being equal to the width of the line portion, and a width of the second end being equal to the width of the finger;
    an insulating layer, the insulating layer covering most of the wiring layer; the insulating layer being made from polyimide (PI);
    a reinforcing layer, the reinforcing layer covering part of the insulating layer to reinforce the mechanical strength of the FPC board an edge portion of the reinforcing layer at a middle portion of the FPC board being wedge-shaped; the reinforcing layer being made from aluminum (Al);
    the line portions of the conductive lines being made from copper foil, the fingers of the conductive lines being made from gilded copper; the wiring layer further comprising a base, a thickness of the base being in the range from 10 gm to 100 gm.

2. The flexible printed circuit board as claimed in claim 1, wherein the FPC board is a nonuniform FPC board.

3. The flexible printed circuit board as claimed in claim 2, wherein the base is made from a material selected from the group consisting of polyimide (PI), polyethylene terephthalate (PET), polyester, and polytetrafluoroethylene (PTFE).

4. A flexible printed circuit board, comprising:
    a wiring layer comprising a plurality of conductive lines, each of the conductive lines comprising a pad, a line portion, and a junction portion connecting the pad and the line portion, a width of the junction portion progressively increasing from a width of the line portion to a width of the pad to prevent overstress or break at the junction when the flexible printed circuit board is bent, two edges of the junction portion being curved lines;
    an insulating layer, the insulating layer covering most of the wiring layer; and
    a reinforcing layer, the reinforcing layer covering part of the insulating layer to reinforce the mechanical strength of the FPC board; an edge portion of the reinforcing layer at a middle portion of the FPC board being wedge-shaped; the reinforcing layer being made from aluminum (Al);
    a thickness of a middle portion of the flexible printed circuit board gradually changing at an edge portion of the reinforcing layer at the middle portion forming a combined thickness of the wiring layer, the insulating layer, and a main portion of the reinforcing layer to a combined thickness of the wiring layer and the insulating layer only;
    the line portions of the conductive lines being made from copper foil; the fingers of the conductive lines being made from gilded copper; the wiring layer further comprising a base, a thickness of the base being in the range from 10 gm to 100 gm.

5. The flexible printed circuit board as claimed in claim 4, wherein the FPC board is a nonuniform FPC board.

6. A flexible printed circuit board, comprising:
    a wiring layer comprising a plurality of conductive lines, each of the conductive lines comprising a pad, a line portion, and a junction portion connecting the pad and the line portion, a width of the junction portion progressively increasing from a width of the line portion to a width of the pad to prevent overstress or break at the junction when the flexible printed circuit board is bent;
    a reinforcing layer, the reinforcing layer covering part of the wiring layer to reinforce the mechanical strength of the FPC board; a thickness of a middle portion of the flexible printed circuit board gradually changing at an edge portion of the reinforcing layer at the middle portion; the edge portion of the reinforcing layer at a middle portion of the FPC board being wedge-shaped;
    an insulating layer disposed between the wiring layer and the reinforcing layer, the insulating layer covering most of the wiring layer.

7. The flexible printed circuit board as claimed in claim 6, wherein two edges of the junction portion are curved lines.

8. The flexible printed circuit board as claimed in claim 6, wherein the FPC board is a nonuniform FPC board.

9. The flexible printed circuit board as claimed in claim 6, wherein the insulating layer is made from polyimide (PI).

10. The flexible printed circuit board as claimed in claim 6, wherein the reinforcing layer is made from aluminum (Al).

* * * * *